(12) United States Patent
Oba

(10) Patent No.: US 7,725,865 B2
(45) Date of Patent: May 25, 2010

(54) METHOD, STORAGE MEDIA STORING PROGRAM, AND COMPONENT FOR AVOIDING INCREASE IN DELAY TIME IN SEMICONDUCTOR CIRCUIT HAVING PLURAL WIRING LAYERS

(75) Inventor: Hisayoshi Oba, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 533 days.

(21) Appl. No.: 11/236,532

(22) Filed: Sep. 28, 2005

(65) Prior Publication Data

US 2006/0220255 A1    Oct. 5, 2006

(30) Foreign Application Priority Data

Mar. 29, 2005    (JP) .............................. 2005-096133

(51) Int. Cl.
```
G06F 17/50      (2006.01)
H03K 17/693     (2006.01)
H01L 23/02      (2006.01)
H01L 29/04      (2006.01)
H01L 29/40      (2006.01)
```
(52) U.S. Cl. ..................... 716/15; 716/1; 716/5; 716/7; 716/9; 716/12; 257/74; 257/203; 257/678; 257/686; 257/773

(58) Field of Classification Search ...................... 716/1, 716/5, 7, 9, 12, 15; 438/18, 622; 257/48, 257/203, 74, 678, 686, 758, 773, 774
See application file for complete search history.

(56) References Cited

U.S. PATENT DOCUMENTS

| | | | |
|---|---|---|---|
| 5,461,259 A * | 10/1995 | Kitamura et al. ............ | 257/758 |
| 6,205,570 B1 * | 3/2001 | Yamashita ..................... | 716/1 |
| 6,310,667 B1 * | 10/2001 | Nakayoshi et al. ........... | 349/42 |
| 6,505,332 B1 * | 1/2003 | Oda ............................. | 716/12 |
| 6,522,173 B1 * | 2/2003 | Otsuka ........................ | 326/101 |
| 6,536,022 B1 * | 3/2003 | Aingaran et al. ............... | 716/5 |
| 6,567,954 B1 * | 5/2003 | Murakoshi ..................... | 716/2 |
| 6,594,805 B1 * | 7/2003 | Tetelbaum et al. ............. | 716/5 |
| 6,611,950 B2 * | 8/2003 | Ishikura ........................ | 716/7 |

(Continued)

FOREIGN PATENT DOCUMENTS

JP    A-04-251964    8/1992

(Continued)

OTHER PUBLICATIONS

Japanese Office Action dated Feb. 2, 2010 in Japanese Patent Application No. 2005-096133.

(Continued)

*Primary Examiner*—Helen Rossoshek
(74) *Attorney, Agent, or Firm*—Staas & Halsey LLP

(57) ABSTRACT

A method for a computer setting up a terminal layer of a semiconductor circuit having plural wiring layers including obtaining various kinds of information such as placement information relating to a plurality of cells or macros of the semiconductor circuit and being mounted onto a circuit board from a storage unit of the computer; comparing a driving capacity of a subject cell or macro, which is contained in the obtained information, and a resistance of wiring for connecting the subject cell or macro with the cell or macro at a connecting destination; and setting up a terminal layer based on a result of the comparing.

15 Claims, 16 Drawing Sheets

U.S. PATENT DOCUMENTS

| | | | |
|---|---|---|---|
| 6,703,792 B2* | 3/2004 | Kawada et al. | 315/169.4 |
| 6,734,458 B2* | 5/2004 | Kim et al. | 257/48 |
| 6,737,749 B2* | 5/2004 | Tomsio et al. | 257/774 |
| 6,809,626 B2* | 10/2004 | Chu et al. | 337/167 |
| 6,831,294 B1* | 12/2004 | Nishimura et al. | 257/48 |
| 7,093,206 B2* | 8/2006 | Anand et al. | 716/1 |
| 7,102,905 B2* | 9/2006 | Funaba et al. | 365/51 |
| 7,103,864 B2* | 9/2006 | Isobe | 716/9 |
| 7,119,383 B2* | 10/2006 | Ohayashi et al. | 257/203 |
| 7,129,101 B2* | 10/2006 | Schultz et al. | 438/18 |
| 7,218,492 B2* | 5/2007 | Shrier | 361/56 |
| 7,247,553 B2* | 7/2007 | Ohayashi et al. | 438/622 |
| 7,254,051 B2* | 8/2007 | Takashima | 365/145 |
| 7,257,796 B2* | 8/2007 | Miller et al. | 716/12 |
| 7,398,497 B2* | 7/2008 | Sato et al. | 716/10 |
| 7,424,695 B2* | 9/2008 | Tamura et al. | 716/14 |
| 7,505,276 B2* | 3/2009 | Dangelmaier | 361/735 |
| 2004/0012938 A1* | 1/2004 | Sylvester et al. | 361/794 |
| 2004/0031010 A1 | 2/2004 | Kaida | |
| 2004/0168144 A1* | 8/2004 | Kurose et al. | 716/12 |
| 2005/0023656 A1* | 2/2005 | Leedy | 257/678 |
| 2005/0139977 A1* | 6/2005 | Nishio et al. | 257/686 |
| 2006/0033110 A1* | 2/2006 | Alam et al. | 257/74 |
| 2006/0168551 A1* | 7/2006 | Mukuno | 716/5 |
| 2006/0192282 A1* | 8/2006 | Suwa et al. | 257/723 |

FOREIGN PATENT DOCUMENTS

| | | |
|---|---|---|
| JP | 8-274181 | 10/1996 |
| JP | 8-274818 | 10/1996 |
| JP | 9-293786 | 11/1997 |
| JP | 2003-044535 | 2/2003 |
| JP | 2003-91567 | 3/2003 |
| JP | 2003-332431 | 11/2003 |

OTHER PUBLICATIONS

Patent Abstracts of Japan, Publication No. 2003-332431, Published Nov. 21, 2003.

Patent Abstracts of Japan, Publication No. 09-293786, Published Nov. 11, 1997.

Patent Abstracts of Japan, Publication No. 2003-044535, Published Feb. 14, 2003.

Patent Abstracts of Japan, Publication No. 2003-91567, Published Mar. 28, 2003.

Patent Abstracts of Japan, Publication No. 8-274181, Published Oct. 18, 1996.

* cited by examiner

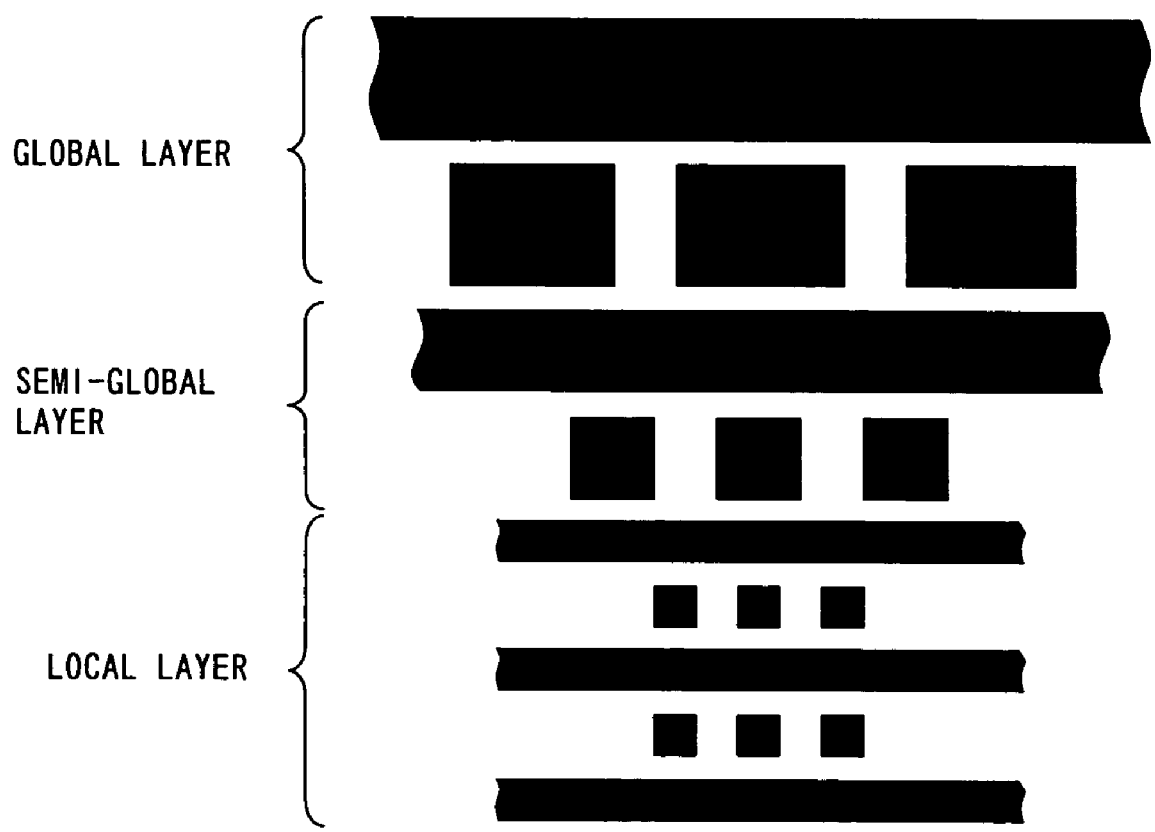
F I G. 3

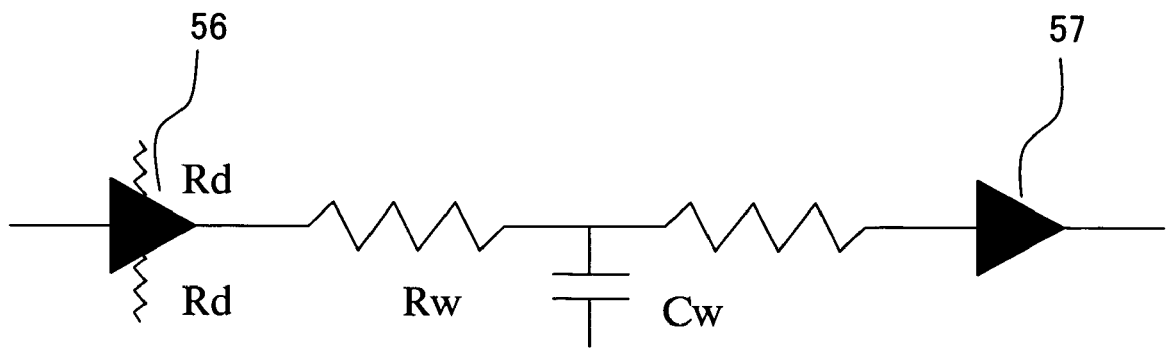
F I G. 8

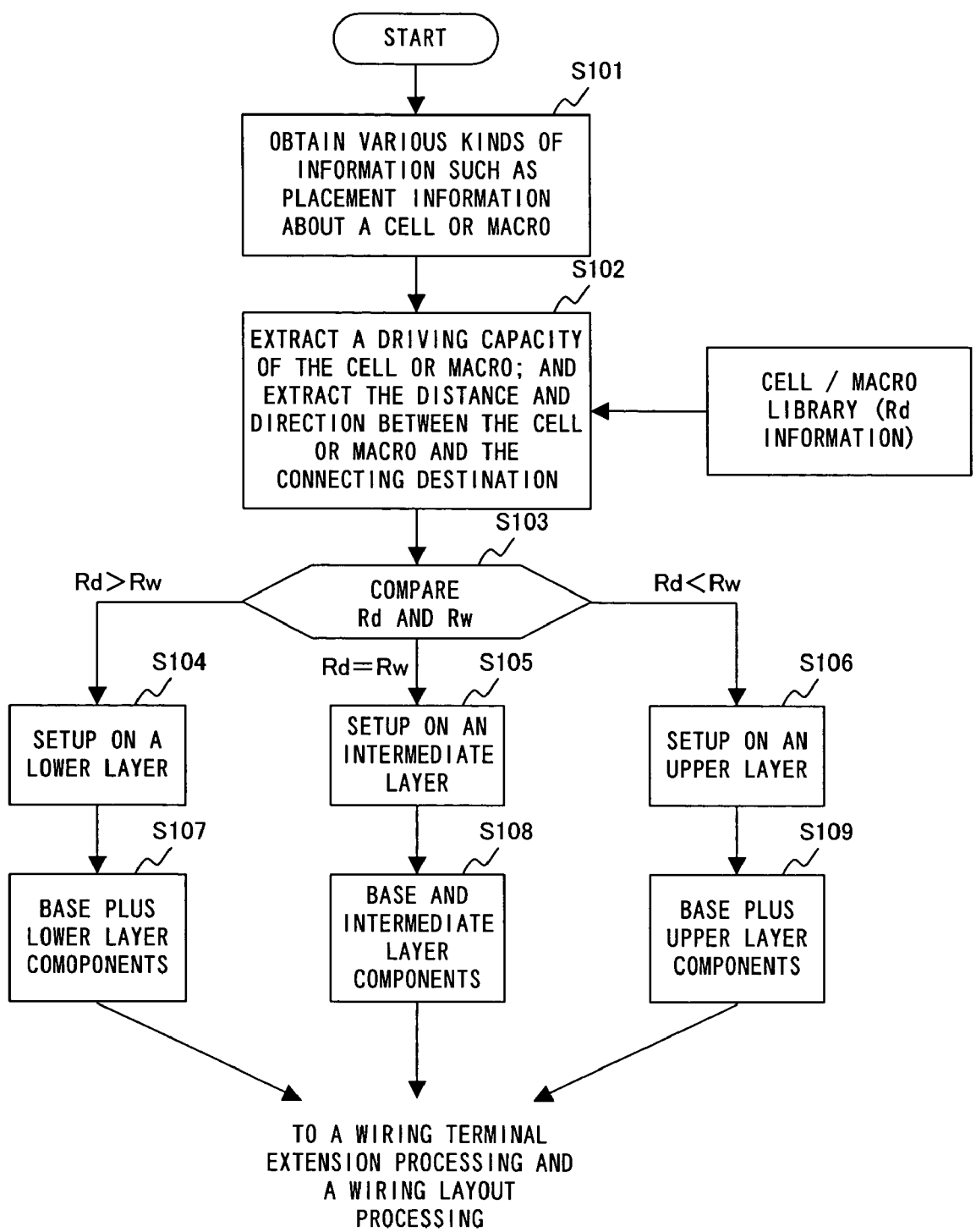
F I G. 9

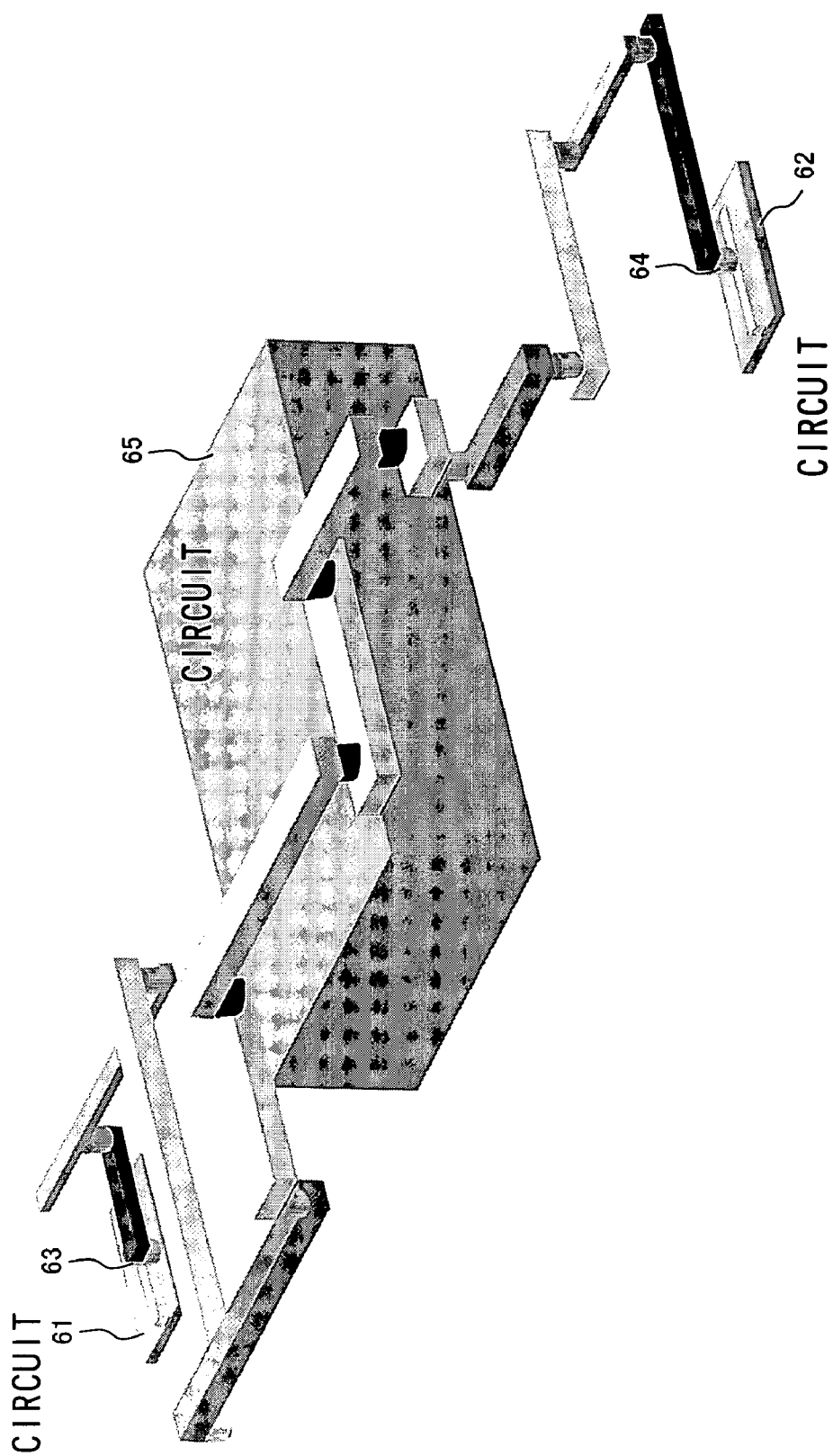
F I G. 10

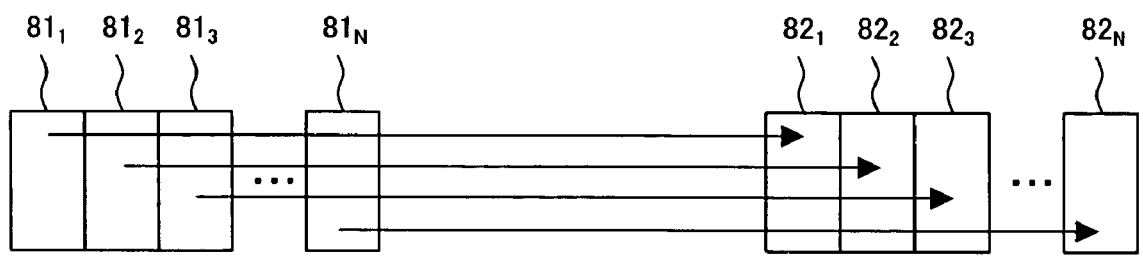
F I G. 13

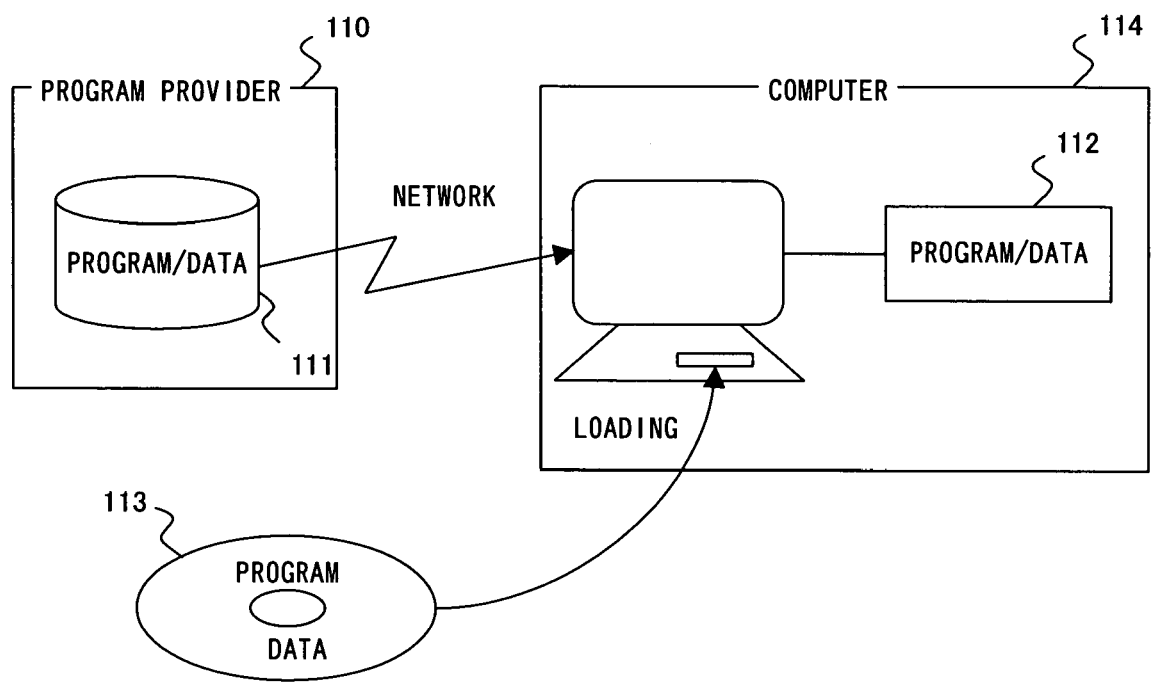
F I G. 15

METHOD, STORAGE MEDIA STORING PROGRAM, AND COMPONENT FOR AVOIDING INCREASE IN DELAY TIME IN SEMICONDUCTOR CIRCUIT HAVING PLURAL WIRING LAYERS

CROSS-REFERENCE TO RELATED APPLICATIONS

This application is based upon and claims the benefit of priority from the prior Japanese Patent Application No. 2005-096133 filed on Mar. 29, 2005, the entire contents of which are incorporated herein by reference.

BACKGROUND OF THE INVENTION

1. Field of the Invention

The present invention relates to a terminal layer setting method for a semiconductor circuit having a plurality of circuit layers, storage media storing a terminal layer setting program, storage media storing a circuit terminal extension processing program and a terminal extending component used for setting of the terminal layer.

2. Description of the Related Art

In recent years, with a quantum leap increase in the number of cells (e.g., logic gate, inverter and NAND) or macros (e.g., SRAM) which are equipped onto a board, separate layers for wiring between these cells and macros have evolved to a plurality of layers, parallel with, and independent of, the board itself.

With regard to a semiconductor circuit having such a plurality of layers, the problem is which of the plurality of layers to go through when connecting a cell or macro with the cell or macro for the respective mating connections as noted in a patent document 1 below for instance.

[Patent document 1] Japanese patent laid-open application publication No. 4-251964, "Automatic Layout Method"

In setting up a wiring layer (i.e., terminal layer) at an extending destination of a wiring terminal for a cell or macro, however, the extending destination has conventionally been set up on the lower layers close to the board in many cases, prioritizing a versatility of the cell or macro. Such practices have created a lot of circuit wiring, also in lower circuit layers, that is, in a local layer with a large resistance, and using of a lot of Vias (also called "contact hole"), and thus caused a delayed circuit operation.

As shown by FIG. 1, as a delay time increases a slew rate of wave form increases, that is, the wave form becoming smoothly shouldered. And the delay time increases in proportion with the wiring capacitance of the circuit (i.e., cell or macro) or the resistance of wiring between the aforementioned circuit and that of the connecting destination, which is well known. In other words, as a wave travels through a circuit with a large wiring capacity or resistance, the wave loses its form rapidly as shown by FIG. 1.

SUMMARY OF THE INVENTION

The challenge of the present invention is to provide a terminal layer setting method, and the related program, which is capable of setting up a wiring layer (i.e., terminal layer) at an extended destination of a cell or macro for the cell or macro mounted onto a board while avoiding an increase in a delay time.

In a first aspect of the present invention, a terminal layer setting method, in the method for a computer setting up a terminal layer of a semiconductor circuit having a plurality of wiring layers, comprises the steps of obtaining various kinds of information such as placement information relating to a plurality of cells or macros constituting the semiconductor circuit and being mounted onto a circuit board, from a storage unit of the computer; comparing between a driving capacity of a subject cell or macro, which is contained in the obtained information, and a resistance of wiring for connecting the subject cell or macro with a cell or macro at a connecting destination; and setting up a terminal layer which is a wiring layer at an extending destination of a wiring terminal for the subject cell or macro based on the comparison result.

Here, a judgment is given as to whether a wiring connecting the subject cell or macro with the cell or macro at the connecting destination is "longer" or "shorter" by comparing between a driving capacity of a subject cell or macro and a resistance of wiring for connecting the subject cell or macro with a cell or macro at the connecting destination. Accordingly, a setup of a wiring layer (i.e., terminal layer) at an extending destination of a wiring terminal of the subject cell or macro based on the comparison (i.e., judgment) result makes it possible to establish a wiring resistance at a reasonable level and set up a wiring layer (i.e., terminal layer) at the extending destination of the subject cell or macro while avoiding an increase in a delay time.

In the above described first aspect, a wiring terminal of a subject cell or macro may be extended to a wiring layer, which is set up as an extending destination, by adding a necessary number of terminal extending components, each of which comprises a Via and wiring having a length thereof for adequately securing a contact with the Via, in the direction normal to a surface which the subject cell or macro is mounted onto.

The normal direction to the surface which the subject cell or macro is mounted onto becomes the shortest path for the wiring terminal of the subject cell or macro extending to the wiring layer at the extended destination and therefore the above described delay time can be further suppressed.

In a second aspect of the present invention, a storage medium for storing a terminal layer setting program, in the program for making a computer set up a terminal layer of a semiconductor circuit having a plurality of wiring layers, wherein the program makes the computer execute the steps of obtaining various kinds of information such as placement information relating to a plurality of cells or macros constituting the semiconductor circuit and being mounted onto a circuit board from a storage unit of the computer; comparing between a driving capacity of a subject cell or macro, which is contained in the obtained information, and a resistance of wiring for connecting the subject cell or macro with a cell or macro at a connecting destination; and setting up a terminal layer which is a wiring layer at an extended part of a wiring terminal for the subject cell or macro based on the comparison result.

According to the present invention, a judgment is given as to whether a wiring connecting the subject cell or macro with the cell or macro at the connecting destination is "longer" or "shorter" by comparing between the driving capacity of a subject cell or macro and the resistance of wiring for connecting the subject cell or macro with a cell or macro at the connecting destination. And accordingly, a setup of a wiring layer (i.e., terminal layer) at an extending destination of a wiring terminal of the subject cell or macro based on the comparison (i.e., judgment) result makes it possible to establish a wiring resistance at a reasonable level and set up a wiring layer (i.e., terminal layer) at the extending destination of the subject cell or macro while avoiding an increase in a delay time.

BRIEF DESCRIPTION OF THE DRAWINGS

FIG. 2 is a oblique perspective view of a structure of a plurality of wiring layers comprised by a semiconductor circuit which a terminal layer setting processing according to a preferred embodiment of the present invention is applied to;

FIG. 3 is a cross sectional view of a structure of plurality of wiring layers comprised by a semiconductor circuit with the number of wiring layers set as nine;

FIG. 8 describes a terminal layer setting method according to the present embodiment;

FIG. 9 is a flow chart of terminal layer setting processing according to the present embodiment;

FIG. 10 is a diagonal perspective view of a state of a wiring layer after applying a wiring processing by a conventional technique;

FIG. 13 exemplifies a circuit wiring with a congestion of wires;

FIG. 15 describes a loading of program.

DESCRIPTION OF THE PREFERRED EMBODIMENTS

The following describes a preferred embodiment of the present invention in detail while referring to the accompanying drawings.

Figure 1:
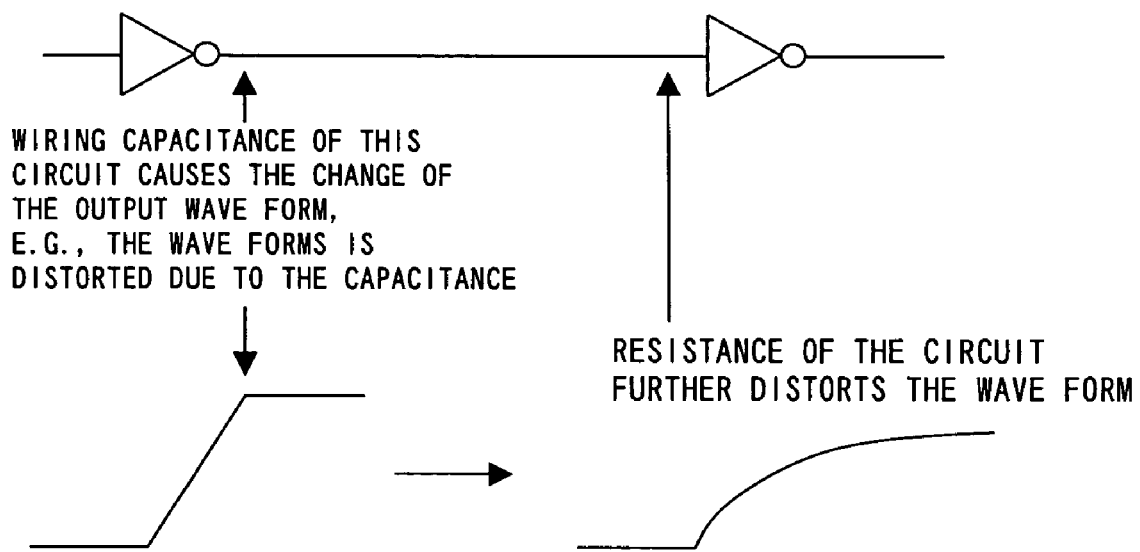
FIG. 1 describes a problem of conventional technique.
Figure 2:
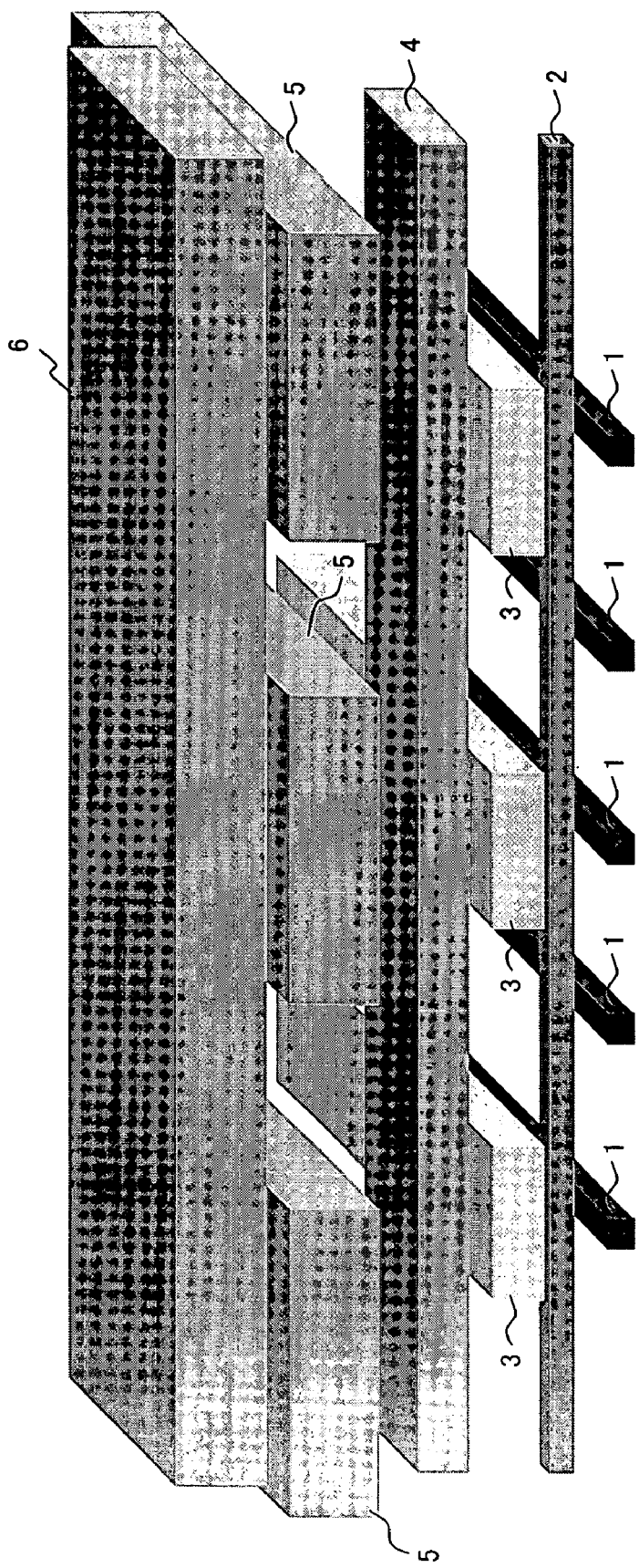

FIG. 2 is a oblique perspective view of a structure of a plurality of wiring layers comprised by a semiconductor circuit which a terminal layer setting processing according to a preferred embodiment of the present invention is applied to.

In FIG. 2, shows six wiring layers 1 through 6 set up on a board (not shown herein) which a cell or macro is mounted onto. Here, the wiring layers 1 and 2 are called local layers on which a wire width, a wire height and the pitch between wires are all the smallest among the wiring layers 1 through 6. The wiring layers 5 and 6 are called global layers in which a wire width, a wire height and the pitch between wires are all the largest among the wiring layers 1 through 6. The wiring layers 3 and 4 are called semi-global layers in which a wire width, a wire height and the pitch between wires are all in intermediate values (i.e., larger than in the wiring layers 1 and 2, but smaller than in the wiring layers 5 and 6) among the wiring layers 1 through 6. FIG. 2 exemplifies a configuration of six layers of wiring layers, with each of the local, semi-global and global layers having two layers.

The total number of wiring layers and that of each dominated layer such as the local layer are predetermined appropriately by a circuit design engineer. For example, FIG. 3 shows a case of nine wiring layers, with five for the local, two for semi-global and two for global layers. As shown by FIGS. 2 and 3, the wiring runs usually perpendicular to each other between the adjacent layers.

Incidentally, there is an insulation film between respective wiring layers, and also there is the one between wiring patterns within each wiring layer, although FIG. 2 or 3 does not specifically show them.

Figure 4A:
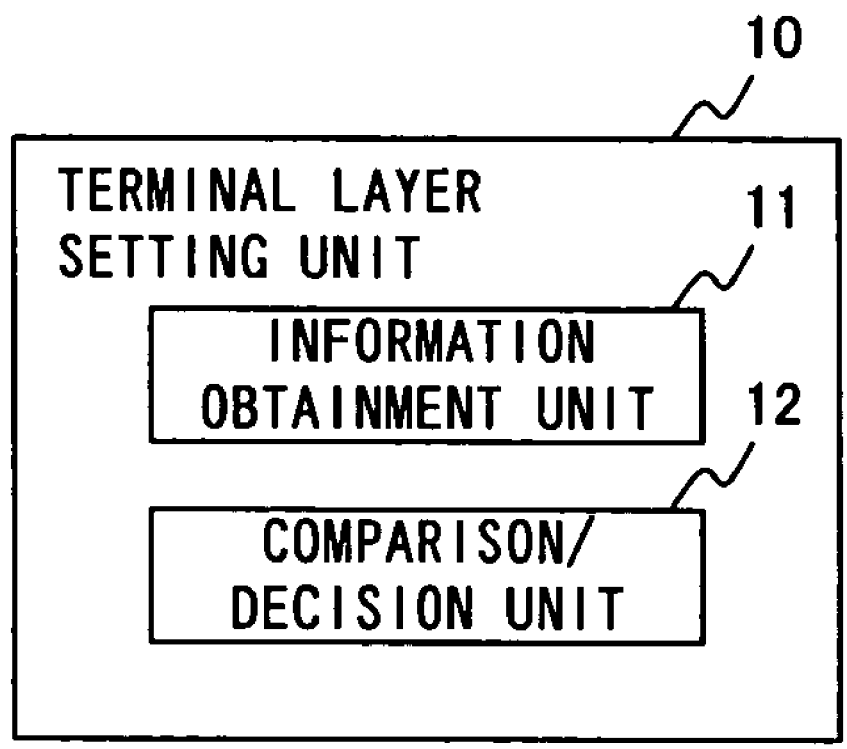
FIG. 4A is a block diagram showing a configuration of a terminal layer setting unit according to a preferred embodiment of the present invention.

FIG. 4A is a block diagram showing a configuration of a terminal layer setting unit according to a preferred embodiment of the present invention. The terminal layer setting unit can be realized by software being installed in a computer for example.

As shown in FIG. 4A, the terminal layer setting unit 10 comprises an information obtainment unit 11 for obtaining various kinds of information such as placement information relating to a plurality of cells or macros being mounted onto a circuit board from a secondary storage of the above described computer and a comparison/decision unit 12 for comparing between a driving capacity of a subject cell or macro, which is contained in the obtained information, and a resistance of wiring for connecting the subject cell or macro with a cell or macro at a connecting destination, and setting up a terminal layer which is a wiring layer at an extending destination of a wiring terminal for the subject cell or macro based on the comparison result.

Figure 4B:
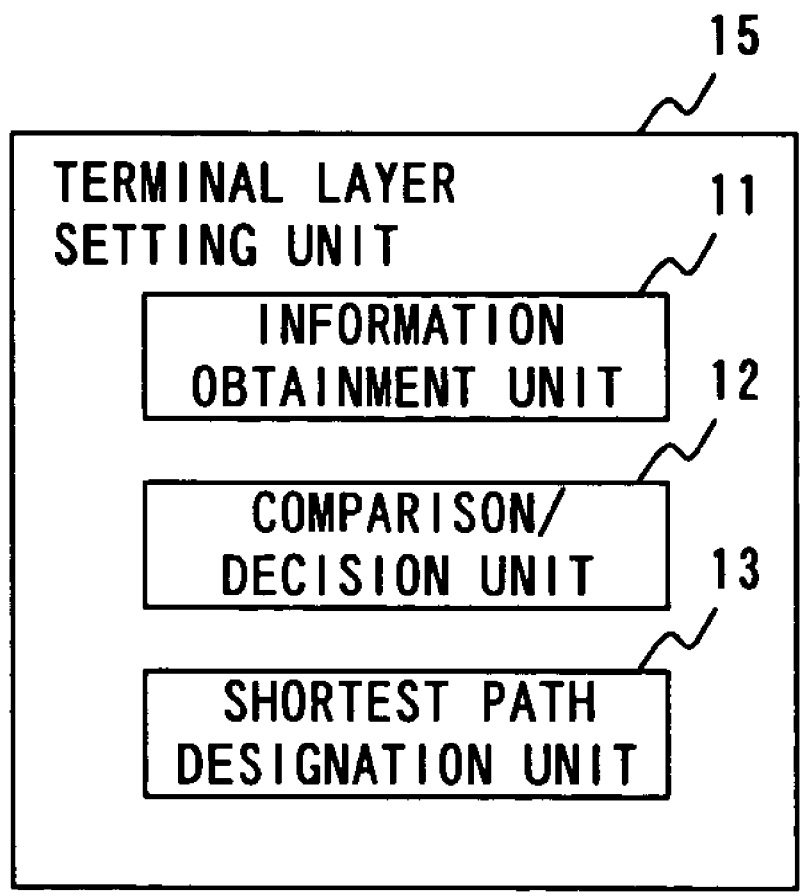
FIG. 4B is a block diagram showing a variation of the configuration of the terminal layer setting unit shown by FIG. 4A.

Meanwhile in FIG. 4B, a terminal layer setting unit 15 further comprises a shortest path designation unit 13 for designating the extension of wiring terminals of a plurality of cells or macros to the determined wiring layer in the shortest paths. It is also possible to comprise a terminal layer setting unit as shown by FIG. 4B.

Figure 5:
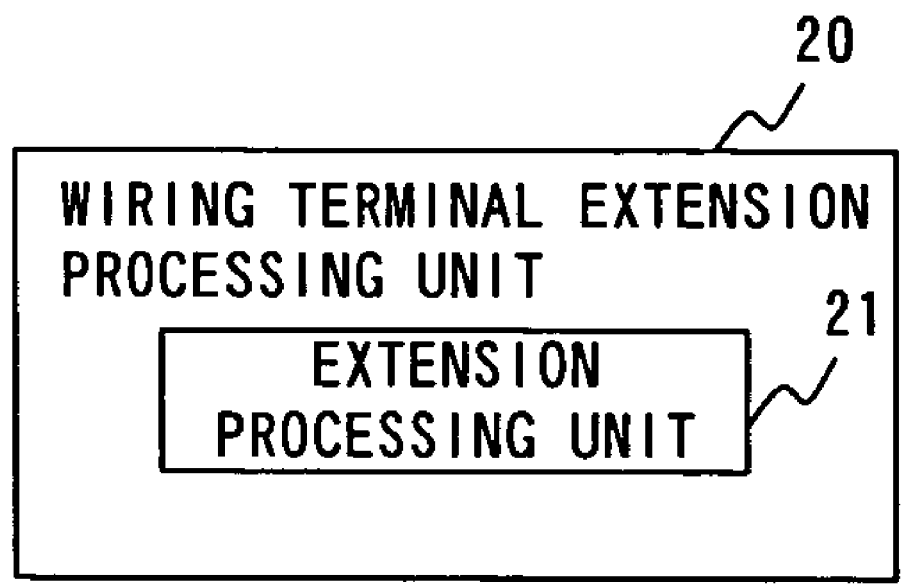
FIG. 5 is a block diagram showing a configuration of wiring terminal extension processing unit according to a preferred embodiment of the present invention.

FIG. 5 is a block diagram showing a configuration of a wiring terminal extension processing unit according to a preferred embodiment of the present invention. The wiring terminal extension processing unit is accomplished by software being installed in a computer for example.

The wiring terminal extension processing unit 20 of FIG. 5 executes an extension processing of a wiring terminal based on a setup result of a terminal layer which is a layer at the extending destination of wiring terminal of a cell or macro. The wiring terminal extension processing unit 20 comprises an extension processing unit 21 for extending a wiring terminal of a cell or macro as a subject of processing (simply, "a (processing) subject cell or macro" hereinafter) to a designated wiring layer by adding a necessary number of terminal extending components, each of which comprises a Via and a wiring having a length thereof for adequately securing a contact with the Via, in the normal direction to a surface which the subject cell or macro (the cell or macro to be processed) is mounted onto.

Figure 6:
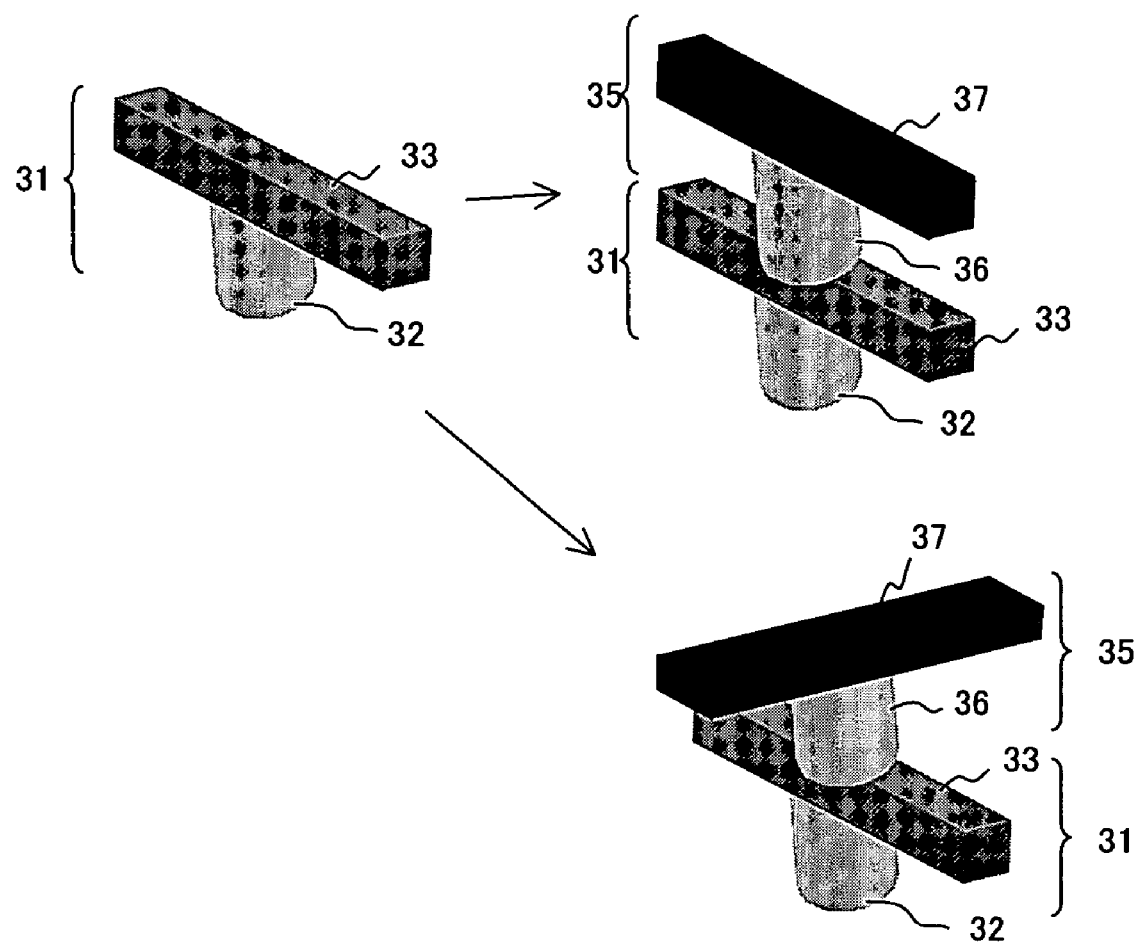
FIG. 6 shows a terminal extending component and examples of combination thereof (No 1)

FIG. 6 is a diagonal perspective view of a terminal extending component and examples of combination thereof. As shown by FIG. 6, a terminal extending component 31 comprises a Via 32 and a wiring 33 having the shortest possible protruding length. The length of the wiring 33 is the length for securing the contact between the wiring 33 and the Via 32. And any length of the wiring shorter than the shortest possible protruding length will not secure an adequate contact characteristic.

It is possible to add another terminal extending component 35 comprising a Via 36 and a wiring 37 to the terminal extending component 31 comprising the Via 32 and the wiring 33 so as to extend in a certain direction as shown in FIG. 6.

Figure 7:
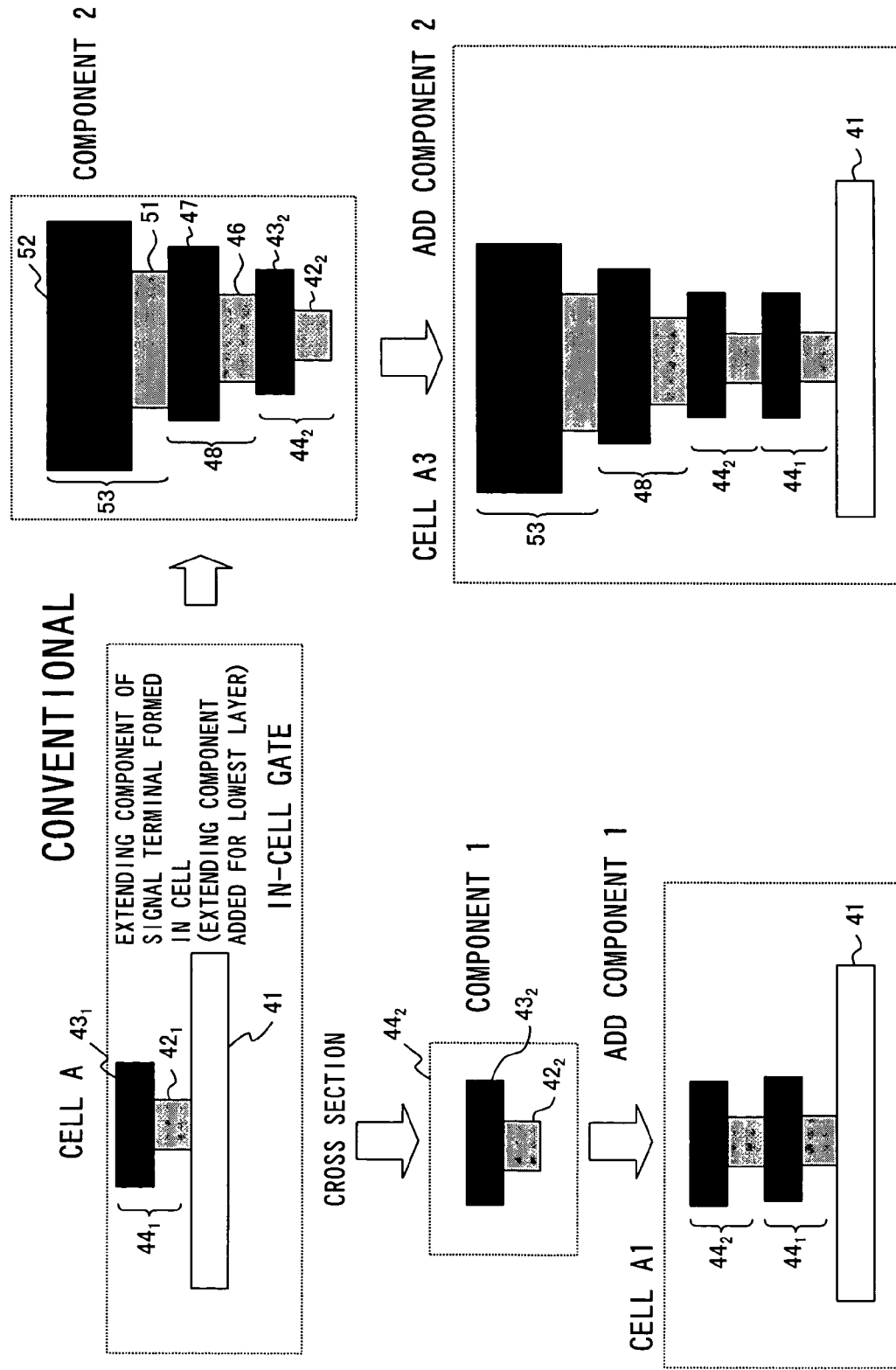
FIG. 7 shows a terminal extending component and examples of combination thereof (No 2)

Incidentally, a Via diameter of the above Via and the length of the wiring securing the contact between the Via is determined based on the size of wiring on the wiring layer as shown in FIG. 7.

In FIG. 7, in the case of extending a wiring terminal to a local layer most adjacent to a gate 41 of the subject cell, a terminal extending component $44_1$ comprising a Via $42_1$ and a wiring $43_1$ having the shortest possible protruding length comparable to the Via $42_1$ is, for example, added to the gate 41.

Additionally, in the case of extending to the local layer having the same wiring size as the local layer most adjacent to a cell which is up by one layer from the one most adjacent to the cell, a terminal extending component $44_2$ comprising a Via $42_2$ and a wiring $43_2$ having the shortest possible protruding length comparable to the Via $42_2$ is added to the terminal extending component $44_1$. In this case, since the terminal extending components $44_1$ and $44_2$ are the ones corresponding respectively to the wiring layer having the wiring of the same size, the Via diameter of the Vias $42_1$ and $42_2$, and the protruding length of the wiring $43_1$ and $43_2$, are the same respectively.

Likewise, in the case of extending the wiring terminal to the layer which is up by three layers from the local layer most adjacent to the cell, if the local layer which is up by one layer from the local layer most adjacent to the cell has the same wiring size as the layer most adjacent to the cell and the wiring size becomes larger for the next upper and the next upper layers sequently, a terminal extending component 48 comprising a Via 46 and a wiring 47 having the shortest possible protruding length comparable to the Via 46, and a terminal extending component 53 comprising a Via 51 and a wiring 52 having the shortest possible protruding length comparable to the Via 51, are added sequently, in addition to the terminal extending component $44_2$, on top of the terminal extending component $44_1$. In this case, since these terminal extending components $44_2$, 48 and 53 are the ones corresponding to the wiring layers having larger wiring sizes in order thereof, the relationships are expressed by the inequality as follows:

Via diameters of Via $42_2$<of Via 46<of Via 51; and

Protrusion lengths of wiring $43_2$<of wiring 47<of wiring 52

The next description is about a setting method for a terminal layer according to the present embodiment. The fact that an increased delay time affects circuit operation, et cetera, is well known.

As shown in FIG. 8, a delay time is evaluated by comparing between the resistance Rw of wiring for connecting a subject cell or macro 56 with a cell or macro 57 at a connecting destination and the driving capacity (i.e., driver resistance) Rd of the subject cell or macro 56 in the present embodiment. That is, if the driver resistance Rd of the subject cell or macro is smaller than the resistance Rw of wiring for connecting the subject cell or macro with a cell or macro at a connecting destination, the judgment is that the wiring length is "longer", hence occurring a delay time, whereas if the driver resistance Rd of the subject cell or macro 5 is larger than the resistance Rw of wiring for connecting the subject cell or macro with a cell or macro at a connecting destination, then the judgment is that the wiring length is "shorter". Note that the wiring load measure used for evaluating such a delay time is a wiring capacitance Cw, in addition to the wiring resistance Rw. A wiring capacitance Cw is taken into consideration when a subject cell or macro is connected to cells or macros beyond a plurality of branches. Meanwhile, a driver resistance is a value resistance converted from a current flowing when a transistor is charged and discharged through a wiring, which varies in proportion with a transistor size.

If the wiring length is judged to be "longer" by the above described comparison between the driver resistance Rd and the wiring resistance Rw, a wiring layer (i.e., terminal layer) for an extending destination of wiring terminal of the subject cell or macro is set up between wiring layers having a wiring with a small resistance per unit length. On the other hand, if the wiring length is judged to be "shorter", a wiring layer (i.e., terminal layer) for an extending destination of wiring terminal of the subject cell or macro is set up between wiring layers having a wiring with a large resistance per unit length.

FIG. 9 is a flow chart of terminal layer setting processing according to the present embodiment. This processing flow is carried out by the terminal layer setting unit shown by FIGS. 4A or 4B.

In FIG. 9, first, various kinds of information such as placement information of a plurality of cells or macros being mounted onto a circuit board is obtained by the information obtainment unit 11 from the secondary storage of a computer in step S101. And in subsequent step S102, a driving capacity (i.e., driver resistance Rd) of a subject cell or macro is extracted, and distances in the vertical and/or horizontal directions from the pieces of placement information about a subject cell or macro and the cell or macro at the connecting destination is extracted, which are all contained in the obtained information. By multiplying the resistance, per unit length, of the wiring used for connecting the subject cell or macro with the cell or macro at the connecting destination by the extracted distance, the wiring resistance Rw of the wiring connecting between the subject cell or macro and the cell or macro at the connecting destination is calculated.

Then, in step S103, the driver resistance Rd obtained in the step S102 and the resistance Rw calculated are compared.

Note that the general practice is to setup a wiring layer having a wiring with a small width and height, that is, small cross-section area size, on lower layers (i.e., close to the board) so that the cross-section area size of wiring becomes larger as going up the wiring layers as shown in FIG. 2. Accordingly, if the driver resistance Rd is larger than the wiring resistance Rw by the result of comparison in the step S103, a lower wiring layer having a large resistance (i.e., small cross-sectional area of wiring) is set as a wiring layer (i.e., terminal layer) of an extending destination of the subject cell or macro in step S104. Or, if the driver resistance Rd is equal to the wiring resistance Rw, a middle wiring layer (i.e., intermediate layer) having an intermediate resistance value (i.e., intermediate value of cross-section area of wiring) is set as a wiring layer (i.e., terminal layer) of an extending destination of the subject cell or macro in step S105. Or, if the driver resistance Rd is smaller than the wiring resistance Rw, a higher wiring layer having a small resistance (i.e., large cross-sectional area size of wiring) is set as a wiring layer (i.e., terminal layer) of an extending destination of the subject cell or macro in step S106.

Incidentally, in any of the cases of the steps S104, S105 or S106, if the instruction is made by the shortest path designation unit 13 of FIG. 4B so as to carry out an extension of the wiring terminal of a plurality of cells or macros to a determined wiring layer in the shortest path, in accordance with the instruction, an adding pattern of the terminal extending components to be added to each of the wiring terminal of the plurality of cells or macros is determined.

For instance, for the step S104 in which the wiring layer of the extended part is set up on a lower wiring layer, the instruction is made in step S107 so as to add a lower layer terminal (i.e., terminal extending component $44_1$ of FIG. 7) to a base terminal (e.g., the gate 41 of FIG. 7). Also for instance, for the step S105 in which the wiring layer of the extended part is set up on an intermediate wiring layer, the instruction is made in step S108 so as to add an intermediate layer terminal (i.e., terminal extending components $44_1$ plus $44_2$ shown in FIG. 7) to a base terminal (e.g., the gate 41 shown in FIG. 7). Also for instance, for the step S106 in which the wiring layer of the extended part is set up on an upper wiring layer, the instruction is made in step S109 so as to add an upper layer terminal (i.e., terminal extending components $44_1$, $44_2$, 48 and 53 shown in FIG. 7) to a base terminal (e.g., the gate 41 shown in FIG. 7).

If any the steps S107, S108 or S109 is carried out, it goes without saying that the wiring terminal extension processing unit 20 of FIG. 5 carries out the processing of extending the wiring terminal of the cell or macro by using those terminals which are determined to use in the respective steps of the aforementioned steps. And, the setup of the terminal layer are followed by a wiring layout processing unit, which carries out a wiring layout processing, carrying out a processing of connecting between the terminal layers with a wiring in such a way to best use the already set up terminal layers, for instance.

Figure 11:
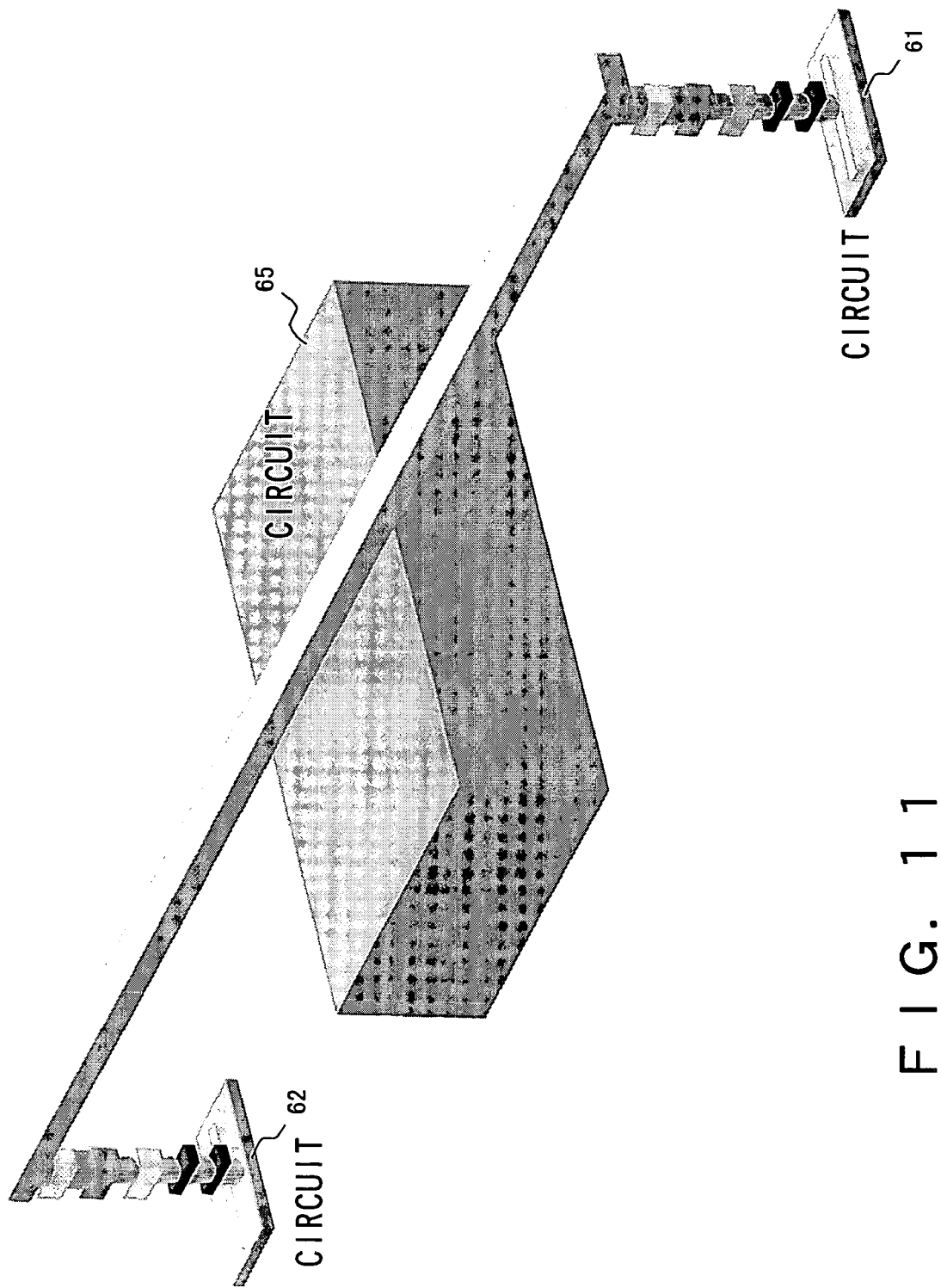
FIG. 11 is a diagonal perspective view of a state of a wiring layer after applying a wiring processing by extending wiring terminal in the shortest path according to the present embodiment.

FIG. 10 is a diagonal perspective view of a state of a wiring layer after applying a wiring processing by a conventional technique; and FIG. 11 is a diagonal perspective view of a state of a wiring layer after applying a wiring processing by extending wiring terminal in the shortest path according to the present embodiment.

As shown by FIGS. 10 and 11, a conductor featured as a column which is called Via (also known as contact hole) connects between wiring layers.

In FIG. 11, since a path to the upper layer is designated as the shortest path, the wiring layers are connected by adding the necessary number of terminal extending components comprising a Via and a wire having a shortest possible length of protrusion comparable to the Via to a circuit 61 or circuit 62 in the direction normal to the board surface which the circuit 61 or circuit 62 is mounted onto. That is, the necessary contact characteristic is secured by connecting the adjacent terminal extending components by wiring having the smallest possible protrusion length.

In either of FIGS. 10 and 11, a connection is applied between the circuit 61 (i.e., cell or macro) and the circuit 62 at the connecting destination by way of an upper wiring layer in order to avoid another circuit 65 on the board.

In the conventional technique shown in FIG. 10, the circuit 61 and the circuit 62 at the connecting destination comprises a Vias 63 or 64 only added to a wiring terminal. That is, since the priority is placed on designing a circuit for versatility, the conventional technique does not have an element corresponding to the terminal extending component added onto a wiring terminal of each circuit as with the present embodiment and therefore there is no practice such as an addition of the necessary number of terminal extending components in the direction normal to the board surface which the circuit 61 or circuit 62 is mounted onto as shown by FIG. 11.

Incidentally, if the shortest path is not specified, even the processing according to the present embodiment wiring routing may occur just as the same as the conventional technique shown in FIG. 10. In the present embodiment, however, by comparing the driver resistance with the wiring resistance between the circuits as described above, through which layer to connect a circuit is determined, hence rendering a great effect in avoiding a delay time compared to the conventional technique, which does not require a particular mention.

And the case of specifying the shortest path to the layer set up as described above as shown in FIG. 11 makes it possible to further shorten the length of the wiring connecting between the circuits, thereby further improving in reducing a delay time.

Incidentally, since the position of the circuit 61 identifies with that of the circuit 62 at the connecting destination in the direction of left to right in the example shown in FIG. 11, there is no need for a wiring routing on the wiring layer nearby a specified wiring layer in setting up a wiring layer used for connecting the circuit 61 with the circuit 62 at the connecting destination as a result of specifying the shortest path.

Figure 12:
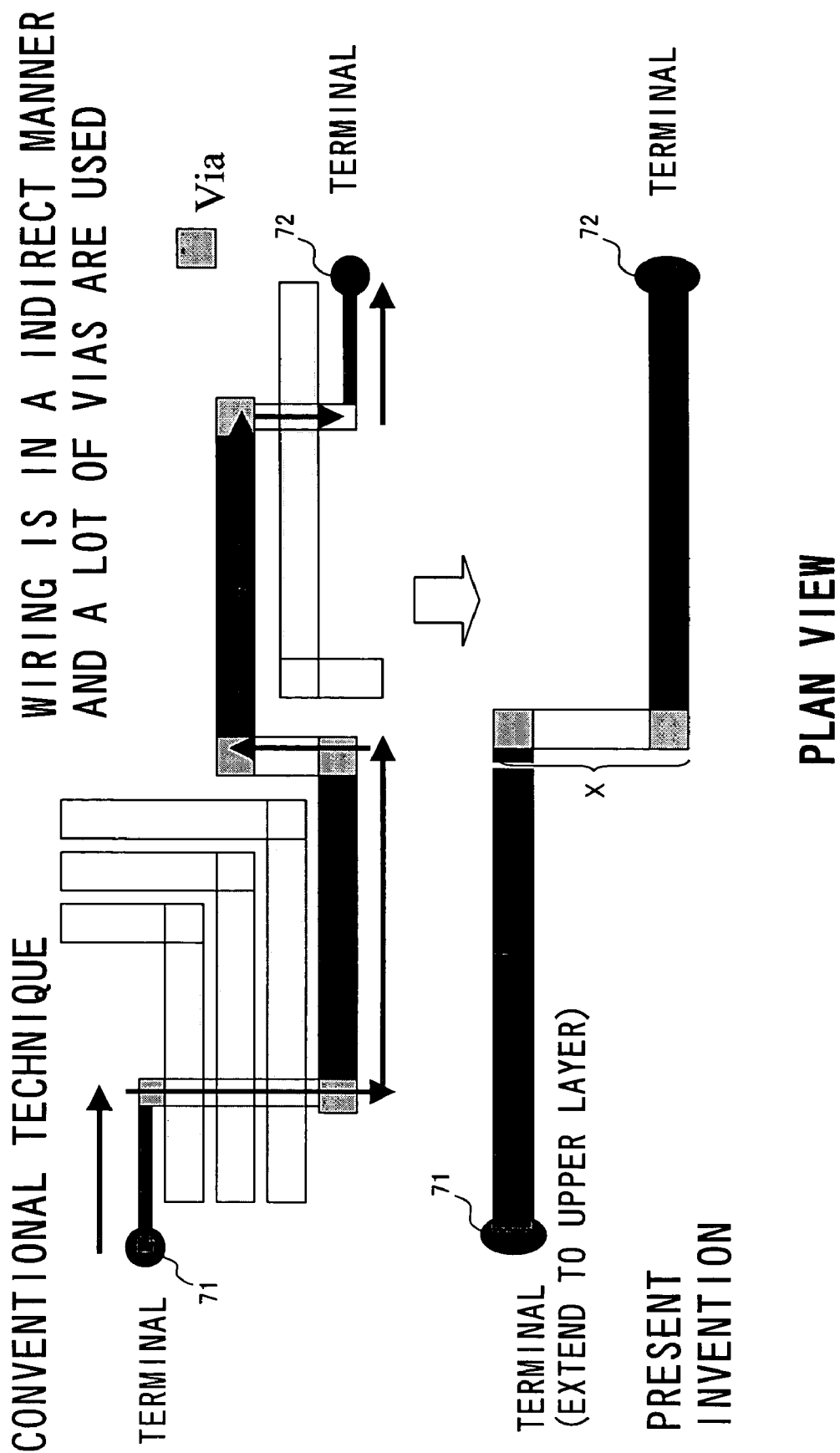
FIG. 12 shows a comparison diagram showing a plan view of states of wiring layers after respective wiring processing is carried out in the conventional technique and in the present embodiment in which the extension of wiring terminal along the shortest path is used.

FIG. 12 shows a comparison diagram showing a plan view of states of wiring layer after respective wiring processing is carried out in the conventional technique and in the present embodiment in which the extension of wiring terminals along the shortest path is used.

The major difference between FIG. 12 and FIGS. 10 and 11 is that the position of a circuit (i.e., terminal 71 in the case of FIG. 12) does not identify with that of the circuit at the connecting destination (i.e., terminal 72 in the case of FIG. 12) in the direction of left to right. In such a case, in the present embodiment, in the section X shown by the bottom part of FIG. 12, on a wiring layer one layer lower, than an upper layer specified for the extending destination of the terminal 71, the wiring processing in the direction of left to right is carried out, and a terminal layer is set up on a wiring layer which is set as said extending destination and on the neighboring wiring layer so as to make it possible to route wiring on a neighboring layer of a wiring layer that is specified as the extending destination.

Incidentally, if a subject cell or macro is connected with no less than a certain number of cells or macros, the wiring capacitance of the subject cell or macro becomes large, tending to make more delay time. In such a case, the wiring layers at the extended parts of the wiring terminals of the subject cell or macro is set on wiring layers having a small wiring capacitance per unit length among a plurality of wiring layers in a distributed way as much as possible.

Note that the given expression is: wiring capacitance=dielectric constant (of insulation film between wires)*cross-sectional area of wiring/distance (i.e., pitch between wiring, or distance between upper and lower wiring). This makes the wiring capacitance on the local layer farthest from the board the smallest among all local layers. Also, that of the semi-global layer is smaller than that of the local layer, and that of the global layer is smaller than that of the semi-global layer, because of the respective distances from the board. Furthermore, the wiring capacitances of the semi-global and global layers are even smaller than that of the local layer in consideration of the pitches between wiring on the semi-global and global layers being larger than that of the local layers.

Therefore, the above described "wiring layer having a small wiring capacitance per unit length" means specifically a layer farthest from the board among the semi-global, global and local layers.

Meanwhile, if a board area concentrated with wiring between a cell or macro and the cell or macro at the connecting destination is specified based on the information contained in the one obtained by the information obtainment unit 11 shown in FIG. 4A or 4B, the wiring layers at the extended part of the cell or macro for the cell or macro included within the specified area will be set up in a plurality of wiring layers in a distributed way.

FIG. 13 exemplifies a circuit wiring with a congestion of wires.

In FIG. 13, logic circuits $81_1$, $81_2$, $81_3$ and through to $81_N$ are laid out horizontally on the board, with these logic circuits $81_1$, $81_2$, $81_3$ and through to $81_N$ being connected with the logic circuits $82_1$, $82_2$, $82_3$ and through to $82_N$, respectively, at the connecting destination, there are areas where the wiring is congested between these logic circuits.

Particularly in this example, if a processing is carried out according to the processing flow shown by FIG. 9 of the present embodiment and if the driver resistance of the logic circuits $81_1$, $81_2$, $81_3$ and through to $81_N$ are the same, the distances to the connecting destinations will be the same, hence ending up with setting up on the same wiring layer as the extending destinations of the wiring terminals for the N-number of logic circuits and failing to resolve the problem of the congestion of wiring in spite of having a plurality of wiring layers.

Accordingly, in such a case where an area of wiring congestion is specified, the above described inconvenience is avoided by setting up the wiring layers of the extending destination of cells or macros for the cells or macros included in the area in among the plurality of wiring layers in a distributed manner.

Note that wiring is judged to be either "longer" or "shorter" by comparing a driving capacity (i.e., driver resistance) of a subject cell or macro with a wiring resistance between the subject cell or macro and the cell of macro at the connecting destination to set up the wiring layer of the wiring terminal of the subject cell or macro at the extending destination in the above description.

A use of the method which adds the terminal extending components making it possible to extend a wiring terminal of the subject cell or macro to the terminal layer at the extended part by the shortest path enables the inventing entity of the present invention to assert an effect of reducing a delay time of circuit operation for a discretionary logic capable of distributing wiring layers at the extending destination in among a plurality thereof.

Figure 14:
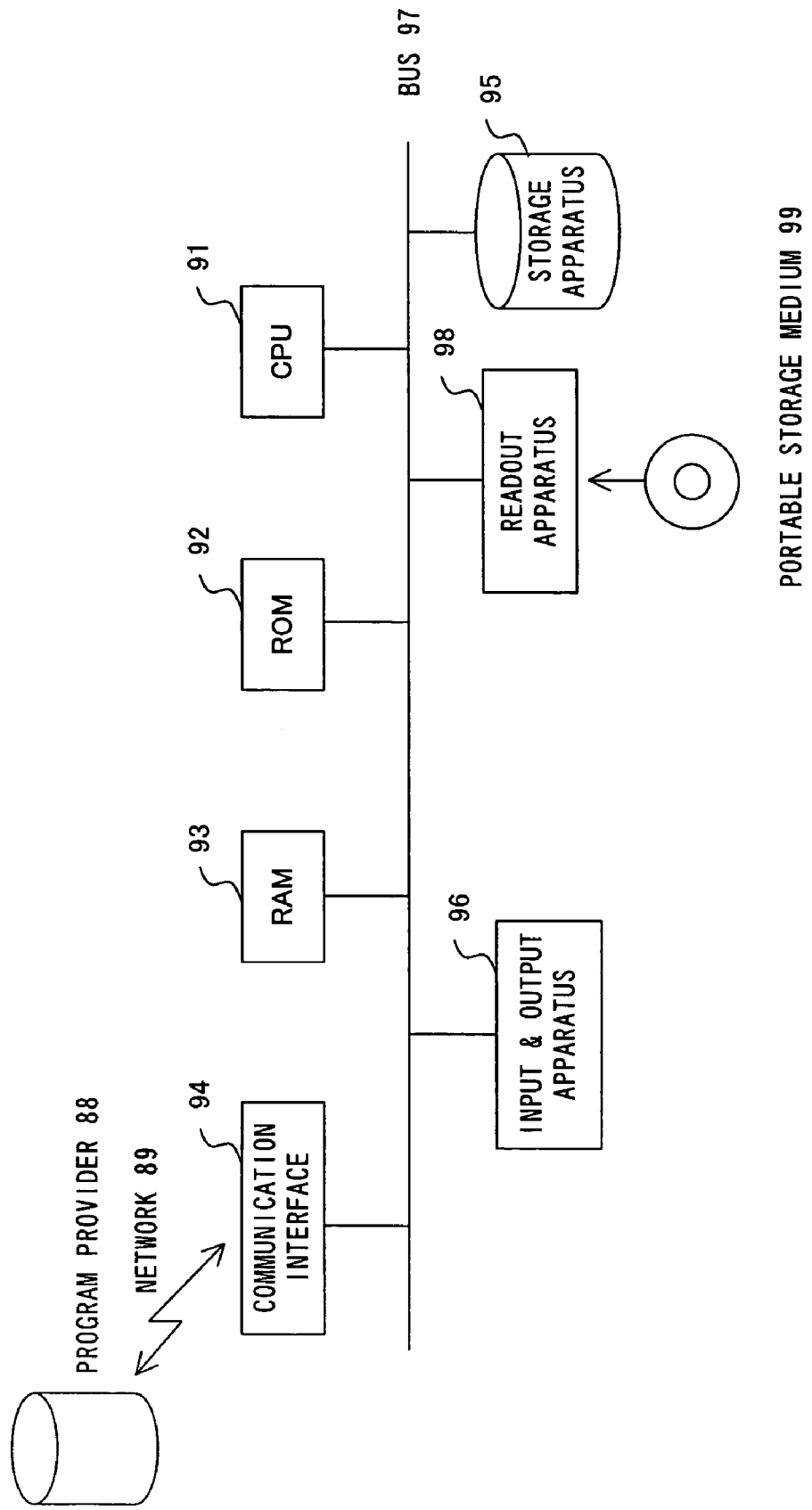
FIG. 14 shows a hardware environment for a program to accomplish each embodiment of the present invention.

It is possible to realize a terminal layer setting unit or the wiring terminal extension processing unit according to the present embodiment by software. FIG. 14 shows a hardware environment for a program to accomplish each embodiment of the present invention.

In FIG. 14, a computer as hardware comprises a CPU 91, a ROM 92, a RAM 93, a communication interface 94, an input & output apparatus 96, a storage apparatus 95, a (storage media) readout apparatus 98, with a bus 97 interconnecting the aforementioned components.

In FIG. 14, the CPU 91 controls the entire computer, and the RAM 93 is a primary storage for temporarily storing data which will be stored in a secondary storage such as the storage apparatus 95 when executing a program or updating data, et cetera.

A user is enabled to give a activate instruction to the terminal layer setting unit, et cetera, through the input & output apparatus 96 which also can see a processing result of the terminal layer setting unit, et cetera through the input & output apparatus 96.

It is also possible to use, within the computer, the program and data either stored in or obtained through various ways such as being stored in the storage apparatus 95, read out of a portable storage medium 99 through the readout apparatus 98 or read out by way of the network 89 and the communication interface of the one provided by an information provider 88.

FIG. 15 describes a loading of program.

The terminal layer setting processing, et cetera, according to the present invention can be accomplished by a common computer 114 of course. In such a case, it is possible to execute the program, et cetera, for processing of the present invention by loading from the storage apparatus 112, from a portable storage medium 113, from a storage apparatus 111 of a program provider 110 by way of a network, into the memory of the computer 114.

What is claimed is:

1. A terminal layer setting method, in the method for a computer setting up a terminal layer of a semiconductor circuit having a plurality of wiring layers, comprising:
    obtaining by the computer various kinds of information such as placement information relating to a plurality of cells or macros constituting the semiconductor circuit and being mounted onto a circuit board from a storage unit of the computer;
    comparing between a driver resistance of a subject cell or macro, which is contained in the obtained information, and a resistance of wiring for connecting the subject cell or macro with a cell or macro at a connecting destination by the computer;
    setting up a terminal layer based on a result of the comparing by the computer; and
    outputting a processing result of the setting up the terminal layer by the computer,
    wherein the terminal layer is a wiring layer to which a wiring terminal is extended from the subject cell or macro for connecting the subject cell or macro with the cell or macro at the connecting destination.

2. The terminal layer setting method according to claim 1, wherein the wiring terminal of said cell or macro is extended to the wiring layer set up as an extending destination in a shortest path.

3. The terminal layer setting method according to claim 2, wherein extending the wiring terminal of the subject cell or macro to the wiring layer, which is set up as the extending destination, by adding a necessary number of terminal extending components, each including a Via and a wiring having a length thereof for adequately securing a contact with the Via, in the normal direction to a surface which the subject cell or macro is mounted onto.

4. The terminal layer setting method according to claim 1, wherein, if a wiring routing is required between said subject cell or macro and the cell or macro at the connecting destination of the subject cell or macro, the terminal layer is set up on a wiring layer which is set as said extending destination and on the neighboring wiring layer so as to make it possible to route wiring on the neighboring layer of a wiring layer that is specified as the extending destination.

5. The terminal layer setting method according to claim 1, wherein, if the driver resistance of the subject cell or macro is larger than a wiring resistance based on a distance between the subject cell or macro and the cell or macro at the connecting destination in said comparison, a wiring layer is set up for an extending destination of the wiring terminal of the subject cell or macro between wiring layers having a large wiring resistance per unit length of wiring.

6. The terminal layer setting method according to claim 1, wherein, if the driver resistance of the subject cell or macro is smaller than a wiring resistance based on a distance between the subject cell or macro and the cell or macro at the connecting destination in said comparison, a wiring layer is set up for an extending destination of the wiring terminal of the subject cell or macro between wiring layers having a small wiring resistance per unit length of wiring.

7. The terminal layer setting method according to claim 1, further comprising the steps of
judging whether or not the subject cell or macro is connected with a certain number, or greater, of cells or macros at connecting destinations; and
setting up a wiring layer of the wiring terminal of the subject cell or macro at an extending destination between wiring layers having a small wiring capacitance per unit length of wiring, if the subject cell or macro is judged to be connected to more than or equal to the certain number of cells or macros at the connecting destinations.

8. The terminal layer setting method according to claim 1, further comprising the steps of
identifying an area on said board where wiring between said cells or macros and cells or macros at the connecting destination is congested based on obtained information; and
setting up wiring layers for the cell or macro at an extending destination among a plurality of wiring layers in a distributed manner for the cells or macros included in the area where it is judged to be congested by wiring.

9. A storage media storing a terminal layer setting program, in the program for making a computer set up a terminal layer of a semiconductor circuit having a plurality of wiring layers, comprising:
obtaining various kinds of information such as placement information relating to a plurality of cells or macros constituting the semiconductor circuit and being mounted onto a circuit board from a storage unit of the computer;
comparing between a driver resistance of a subject cell or macro, which is contained in the obtained information, and a resistance of wiring for connecting the subject cell or macro with a cell or macro at a connecting destination; and
setting up a terminal layer based on a result of the comparing,
wherein the terminal layer is a wiring layer to which a wiring terminal is extended from the subject cell or macro for connecting the subject cell or macro with the cell or macro at the connecting destination.

10. The storage media storing the terminal layer setting program according to claim 9, wherein said program further comprising the step of designating to extend a wiring terminal of said plurality of cells or macros to a wiring layer set as an extending destination in the shortest path.

11. The storage media storing the terminal layer setting program according to claim 9, wherein said program further comprising the step of setting up the terminal layer on a wiring layer, which is set as said extending destination, and on the neighboring wiring layer so as to make it possible to route wiring on the neighboring layer of a wiring layer that is specified as the extending destination if a wiring routing is required between said subject cell or macro and the cell or macro at the connecting destination of the subject cell or macro.

12. The storage media storing the terminal layer setting program according to claim 9, wherein, if the driver resistance of the subject cell or macro is larger than a wiring resistance based on a distance between the subject cell or macro and the cell or macro at the connecting destination in said comparison step, a wiring layer is set up for an extending destination of the wiring terminal of the subject cell or macro between wiring layers having a large wiring resistance per unit length of wiring.

13. The storage media storing the terminal layer setting program according to claim 9, wherein, if the driver resistance of the subject cell or macro is smaller than a wiring resistance based on a distance between the subject cell or macro and the cell or macro at the connecting destination in said comparison, a wiring layer is set up for an extending destination of the wiring terminal of the subject cell or macro between wiring layers having a small wiring resistance per unit length of wiring.

14. The storage media storing the terminal layer setting program according to claim 9, further comprising the steps of
judging whether or not the subject cell or macro is connected with a certain number, or greater, of cells or macros at connecting destinations; and
setting up a wiring layer of the wiring terminal of the subject cell or macro at an extending destination between wiring layers having a small wiring capacitance per unit length of wiring, if the subject cell or macro is judged to be connected to more than or equal to the certain number of cells or macros at the connecting destinations.

15. The storage media storing the terminal layer setting program according to claim 9, comprising the steps of
identifying an area on said board where wiring between said cells or macros and cells or macros at the connecting destination are congested based on obtained information; and
setting up wiring layers for the cell or macro at an extending destination among a plurality of wiring layers in a distributed manner for the cells or macros included in the area where it is judged to be congested by wiring.

* * * * *